United States Patent
Zhu et al.

(10) Patent No.: US 12,409,750 B2
(45) Date of Patent: Sep. 9, 2025

(54) PREDICTIVE CONTROL FOR PROACTIVE THERMAL AND ENERGY MANAGEMENT CHARGING

(71) Applicant: GM Global Technology Operations LLC, Detroit, MI (US)

(72) Inventors: Yongjie Zhu, Troy, MI (US); Jun-mo Kang, Ann Arbor, MI (US); Xueyu Zhang, Northville, MI (US); Chunhao J. Lee, Troy, MI (US); Chen-fang Chang, Bloomfield Hills, MI (US); Madhumita Ramesh Babu, Northville, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 166 days.

(21) Appl. No.: 18/323,794

(22) Filed: May 25, 2023

(65) Prior Publication Data

US 2024/0391341 A1 Nov. 28, 2024

(51) Int. Cl.
*B60L 53/62* (2019.01)
*B60L 58/12* (2019.01)
*B60L 58/16* (2019.01)
*B60L 58/24* (2019.01)
*G01R 31/367* (2019.01)
*H01M 10/625* (2014.01)
*H01M 10/633* (2014.01)

(52) U.S. Cl.
CPC ............ *B60L 53/62* (2019.02); *B60L 58/12* (2019.02); *B60L 58/16* (2019.02); *B60L 58/24* (2019.02); *G01R 31/367* (2019.01); *H01M 10/625* (2015.04); *H01M 10/633* (2015.04); *B60L 2240/12* (2013.01); *B60L 2240/14* (2013.01); *B60L 2240/545* (2013.01)

(58) Field of Classification Search
None
See application file for complete search history.

(56) References Cited

U.S. PATENT DOCUMENTS

2018/0141458 A1* 5/2018 Jammoul ............... H01M 10/63
2021/0309111 A1* 10/2021 Jin ........................ G01R 31/382

OTHER PUBLICATIONS

S. Park and C. Ahn, "Computationally Efficient Stochastic Model Predictive Controller for Battery Thermal Management of Electric Vehicle," in IEEE Transactions on Vehicular Technology, vol. 69, No. 8, pp. 8407-8419, Aug. 2020, doi: 10.1109/TVT.2020.2999939. (Year: 2020).*

* cited by examiner

*Primary Examiner* — Hitesh Patel
*Assistant Examiner* — Wenyuan Yang
(74) *Attorney, Agent, or Firm* — CANTOR COLBURN LLP

(57) ABSTRACT

A method for controlling a vehicle charging and thermal operation includes monitoring at least a charge characteristic of a battery system and a thermal characteristic of the battery system. The method predicts a battery system temperature at a future time (t) based at least in part on the monitored characteristics using a predictive physics model and maintains the battery system temperature above a minimum temperature threshold and below a maximum temperature threshold by adjusting a charging profile based at least in part on the predicted battery system temperature.

20 Claims, 2 Drawing Sheets

PREDICTIVE CONTROL FOR PROACTIVE THERMAL AND ENERGY MANAGEMENT CHARGING

INTRODUCTION

The subject disclosure relates to controlling a battery thermal management process, and more specifically, to providing real time control of battery temperature and environment parameters for charging or discharging based on current charge levels, operational conditions, and a predicted future temperature of the battery and future state of charge of the battery.

Vehicles, including gasoline and diesel power vehicles, as well as electric and hybrid electric vehicles, feature battery storage for purposes such as powering electric motors, electronics and other vehicle subsystems. Vehicle battery systems may be charged using power sources such as charging stations, other electric vehicle battery systems and/or an electrical grid. Typically, during charging, discharging, or vehicle parking processes, battery temperatures are controlled by an on/off thermal management strategy to maintain battery temperature below a threshold temperature. Further, battery current and power capability is ceased if the battery system temperature exceeds a predefined threshold, thereby preventing overheating during the charge/discharge operation. The resulting on/off strategy decreases the lifespan of the battery system and can increase the time required to sufficiently or fully charge the battery system. It is desirable to provide a device or system that is capable of maximizing battery life, while at the same time optimizing charge/discharge times.

SUMMARY

In one exemplary embodiment a method for controlling a vehicle charging and thermal operation includes: monitoring at least a charge characteristic of a battery system and a thermal characteristic of the battery system, predicting a battery system temperature at a future time (t) based at least in part on the monitored characteristics using a predictive physics model, and maintaining the battery system temperature above a minimum temperature threshold and below a maximum temperature threshold by adjusting a charging profile based at least in part on the predicted battery system temperature.

In addition to one or more of the features described herein adjusting the charging profile comprises applying a cost function, the cost function being configured to optimize for at least maximum charging power with minimum heating power and minimum cooling power.

In addition to one or more of the features described herein the cost function is further configured to optimize for minimal lithium plating and over-drain.

In addition to one or more of the features described herein the cost function is:

$$J = \sum_{t=1}^{N} \{(1 - C_s(t))^2 + \gamma_1 P_{chrg}^2(t) + \gamma_2 (P_h^2(t) + P_c^2(t))\},$$

and wherein t is the future time of the predicted battery system temperature, Cs(t) is a lithium surface density of the battery system at time t, P2Chrg(t) is a charging power at time t, P2h(t) is a power required to heat the battery system at time t, and P2c(t) is a power required to cool the battery system at time t, and γ1 and γ2 are constants.

In addition to one or more of the features described herein the thermal characteristic of the battery system includes at least a temperature of the battery system.

In addition to one or more of the features described herein the thermal characteristic further includes a rate of change of the temperature of the battery system.

In addition to one or more of the features described herein the charge characteristic of the battery system includes at least one of a current state of charge, state of health, an output voltage, an output current, and a rate of change of the current state of charge.

In addition to one or more of the features described herein comprising monitoring environmental characteristics of the vehicle, wherein the environmental characteristics include at least one of an ambient temperature and a precipitation type.

In addition to one or more of the features described herein comprising monitoring a vehicle dynamics characteristic, the vehicle dynamics characteristic including at least one of a vehicle speed, a vehicle acceleration, a commanded vehicle speed, and a commanded vehicle acceleration.

In another exemplary embodiment a vehicle includes: a battery system; and a battery system controller having a non-transitory memory and a processor, the non-transitory memory storing instructions configured to cause the battery system controller to perform a method of: monitoring at least a charge characteristic of a battery system and a thermal characteristic of the battery system (monitored characteristics), predicting a battery system temperature at a future time (t) based at least in part on the monitored characteristics using a predictive physics model, and maintaining the battery system temperature above a minimum temperature threshold and below a maximum temperature threshold by adjusting a charging profile and heating/cooling profile based at least in part on the predicted battery system temperature In addition to one or more of the features described herein the battery system controller is a single dedicated controller.

In addition to one or more of the features described herein the battery system controller is a plurality of distributed processors including at least one general vehicle controller processor.

In addition to one or more of the features described herein adjusting the charging profile comprises applying a cost function, the cost function being configured to optimize for at least maximum charging power with minimum heating power and minimum cooling power.

In addition to one or more of the features described herein the cost function is further configured to optimize for minimal lithium plating and over-drain In addition to one or more of the features described herein the cost function is:

$$J = \sum_{t=1}^{N} \{(1 - C_s(t))^2 + \gamma_1 P_{chrg}^2(t) + \gamma_2 (P_h^2(t) + P_c^2(t))\},$$

and wherein t is the future time of the prediction, Cs(t) is a lithium surface density of the battery system at time t, PChrg(t) is a charging power at time t, Ph(t) is a power required to heat the battery system at time t, and Pc(t) is a power required to cool the battery system at time t, and γ1 and γ2 are constants.

In addition to one or more of the features described wherein the thermal characteristic of the battery system includes at least a temperature of the battery system.

In addition to one or more of the features described herein the thermal characteristic further includes a rate of change of the temperature of the battery system.

In addition to one or more of the features described wherein the charge characteristic of the battery system includes at least one of a current state of charge, state of health, an output voltage, an output current, and a rate of change of the current state of charge.

In addition to one or more of the features described the method further includes monitoring environmental characteristics of the vehicle, wherein the environmental characteristics include at least one of an ambient temperature and a precipitation type.

In addition to one or more of the features described the method further includes monitoring a vehicle dynamics characteristic, the vehicle dynamics characteristic including at least one of a vehicle speed, a vehicle acceleration, a commanded vehicle speed, and a commanded vehicle acceleration.

The above features and advantages, and other features and advantages of the disclosure are readily apparent from the following detailed description when taken in connection with the accompanying drawings.

BRIEF DESCRIPTION OF THE DRAWINGS

Other features, advantages and details appear, by way of example only, in the following detailed description, the detailed description referring to the drawings in which.

DETAILED DESCRIPTION

Figure 1:
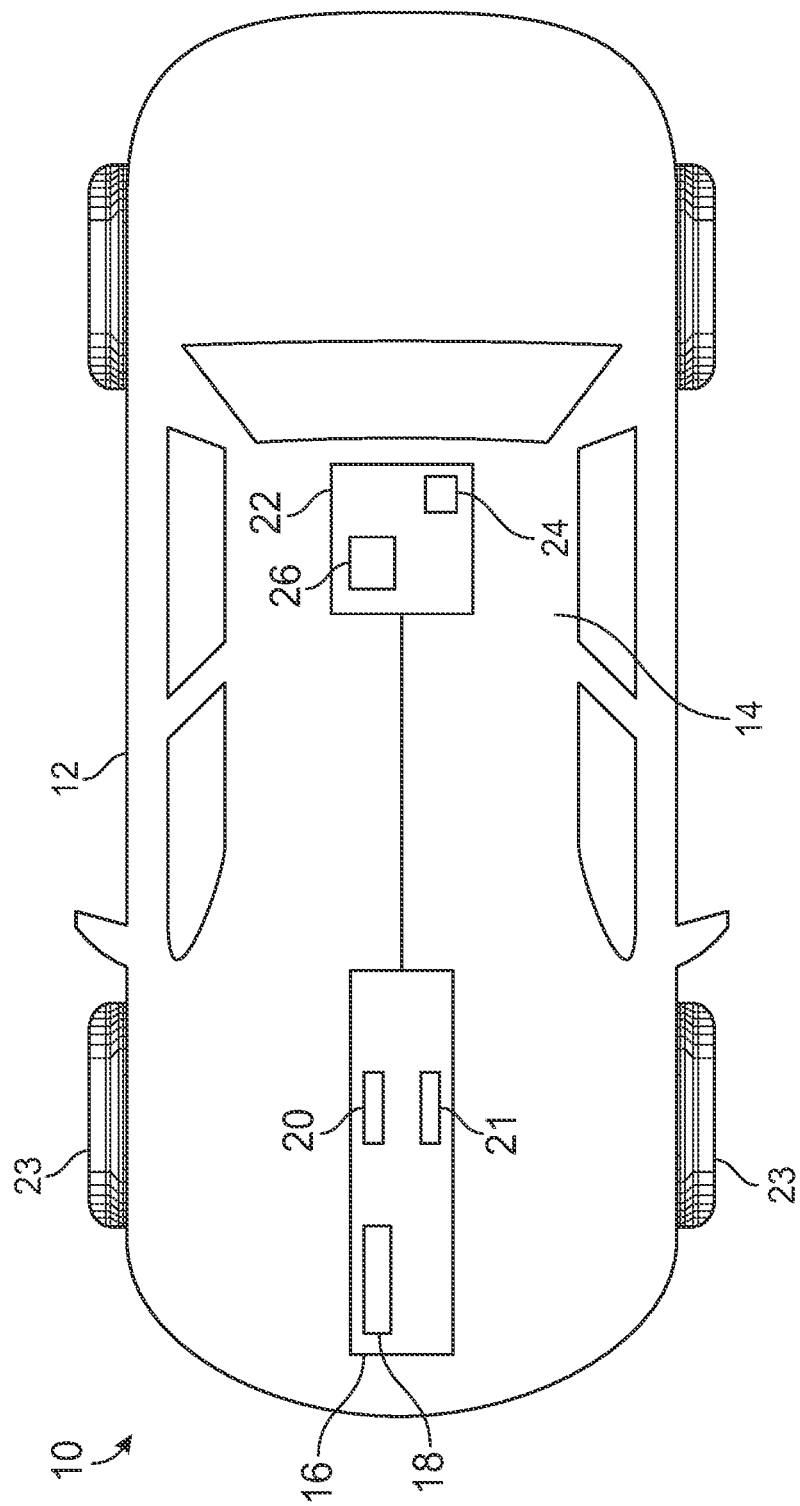
FIG. 1 is a block diagram of a vehicle that includes a battery system configured to adjust a charging profile based at least in part on a predictive thermal condition.

The following description is merely exemplary in nature and is not intended to limit the present disclosure, its application or uses. It should be understood that throughout the drawings, corresponding reference numerals indicate like or corresponding parts and features. As used herein, the term module refers to processing circuitry that may include an application specific integrated circuit (ASIC), an electronic circuit, a processor (shared, dedicated, or group) and memory that executes one or more software or firmware programs, a combinational logic circuit, and/or other suitable components that provide the described functionality.

In accordance with an exemplary embodiment, a vehicle battery control system optimizes a total charging or discharging operation of an onboard battery or other electric storage device (referred to generically herein as a battery system) during charging or driving of the vehicle by predicting an expected temperature of the battery system at a future time and coordinating heating and cooling of the battery system to maintain the battery system within a temperature window throughout the charging and driving operation or during vehicle parking. Maintaining the battery system within the temperature window proactively prevents on/off heating or cooling (referred to as cycling the thermal system) and increases the health and lifespan of the battery system, improves energy utilize efficiency, optimizing charging time.

With continued reference to the general system described above, FIG. 1 shows an embodiment of a motor vehicle 10 configured to implement the predictive control. The vehicle 10 includes a vehicle body 12 defining, at least in part, an occupant compartment 14. The vehicle body 12 also supports various vehicle subsystems including a propulsion system 16, a battery system 22, other subsystems to support functions of the propulsion system 16 and other vehicle components, such as a braking subsystem, a suspension system, a steering subsystem, a fuel injection subsystem, an exhaust subsystem and others.

The vehicle 10 may be a combustion engine vehicle, an electrically powered vehicle (EV) or a hybrid vehicle. In an embodiment, the vehicle 10 is a hybrid vehicle that includes a combustion engine system 18 and at least one electric motor assembly. For example, the propulsion system 16 includes a first electric motor 20 and a second electric motor 21. The motors 20 and 21 may be configured to drive wheels 23 on opposing sides of the vehicle 10. Any number of motors positioned at various additional locations about the vehicle 10 may be used to provide mechanical rotation to corresponding systems and subsystems.

The battery system 22 may be electrically connected to the motors 20 and 21 and/or other components, such as vehicle electronics. The battery system 22 may be configured as a rechargeable energy storage system (RESS), and includes multiple cells partitioned into subsets.

A battery system controller 24 is included within the battery system 22 and controls the charging and discharging functions of the batteries within the battery system 22. In alternative configurations, the battery system controller 24 can be a general vehicle controller remote from the battery system 22 and configured to control multiple systems and/or subsystems. The general vehicle controller can be located at any position within the vehicle 10. In yet further alternatives, the controller 24 can be a distributed control system including multiple coordinating controllers throughout the vehicle 10 encompassing controllers within the battery system 22 and controllers remote from the battery system 22.

During operation of an electric vehicle, or a hybrid electric vehicle, the battery system 22 is discharged in order to provide power to the motors 20, 21. While the vehicle 10 is being operated one or more systems can provide electrical power back to the battery system 22 either through regenerative breaking (in both an electric and a hybrid electric vehicle 10) or through converting excess rotation from an internal combustion engine to electricity (in a hybrid electric vehicle). In either case, the battery controller 24 controls the charge functions and the discharge functions of the battery system 22. While the vehicle 10 is not moving, electric power can be received through a connection to an external power source, such as a wall charger, and the battery system controller 24 controls the receipt of power from the wall charger to the battery system 22. Furthermore, in order to ensure optimum operating conditions, the battery system 22 includes a thermal system 26 that is configured to heat, cool or heat and cool the batteries within the battery system 22. The practical implementation of the thermal system 26 can include any known heating or cooling system capable of heating and cooling the battery system 22.

Conventional vehicle operations monitor the thermal status of the battery during a charge or discharge operation and shut down charging when sensors within the thermal system 26 detect a temperature exceeding a predefined threshold.

During any charging operation, the charging increases thermal characteristics (temperature) within the batteries due to the electrical inefficiencies of the power transfer. Excess temperatures can negatively impact the health of the batteries.

In order to maximize the lifecycle and health of a battery, existing battery systems use look-up tables and rule-based strategies to control the temperature of the battery reactive to the temperature sensor. By way of example, the controllers monitor the temperature within the battery system and turn on cooling when the temperatures exceed a predefined threshold temperature, thereby reducing battery charging power. The batteries are then allowed to cool until the temperature is below a second threshold, at which time charging resumes at its optimal charging power and cooling turns off. The result of this operation is a repeated on/off thermal operation during a charging operation. The repeated on/off operation can shorten the expected life cycle of the batteries and increase the time that it takes to bring the batteries to a full charge.

In order to avoid the repeated on/off operation of the existing thermal systems, the controller 24 within the battery system 22 uses a physics-based model to predict future system states (e.g., the expected battery system temperature in 30 seconds) and proactively control heating and cooling within the battery system 22. This process is referred to generally herein as a "proactive charging and thermal control." In one example, the future state prediction is within the range of 10 seconds to 60 seconds. The proactive heating and cooling maintain the batteries between a minimum temperature (low threshold) and a maximum temperature (high threshold), thereby preventing on/off thermal operation and maximizing the efficiency during charging.

The proactive charging control provides a look ahead distance to predict system response, and proactively manages heating or cooling during charging or driving from a vehicle system level perspective. The predicted system response is generated using a physics-based model that receives monitored thermal characteristics and battery system characteristics, and generates a predicted system state (e.g., a predicted temperature) at a future time, t, based on the monitored characteristics. In some examples, the monitored thermal characteristics can include a battery system temperature and a rate of change of the battery system temperature. Likewise, in some examples, the monitored battery system characteristics can include at least one of a current state of charge, an output voltage, an output current, and a rate of change of the current state of charge, state of health. In yet further examples, additional monitored characteristics can be incorporated into the physics based model including vehicle dynamics (e.g., speed, acceleration, commanded speed, commanded acceleration, and the like) and environmental characteristics (e.g., precipitation type, precipitation severity, ambient temperature, relative windspeed, and the like).

The control strategy not only targets maintaining the battery temperature within the desired range, but also coordinates the power distribution between charging/discharging the battery and thermal operations of heating and cooling the battery based on the predictions to optimize system efficiency and to avoid frequent on/off behavior of the thermal (heating/cooling) system.

In one particular example, the proactive control uses a cost function to optimize a minimum combined use of charging power, heating power, and cooling power, thereby minimizing the total amount of power used in the charging operation while maintaining the battery temperature within the temperature window by expending heating and cooling power. The cost function associates a numerical value, or score, with each possible solution in order to compare them and select the most favorable one, the optimal solution is typically identified as the lowest cost value of the possible solutions. In another particular example, the optimization cost function can further include minimizing for time. Furthermore, depending on the circumstances, the weighting of any given value can be adjusted to increase the weight, or decrease the weight, of the particular value. By way of example, if quick charging is required then the weight of the charging time component of the cost function is increased.

Figure 2:
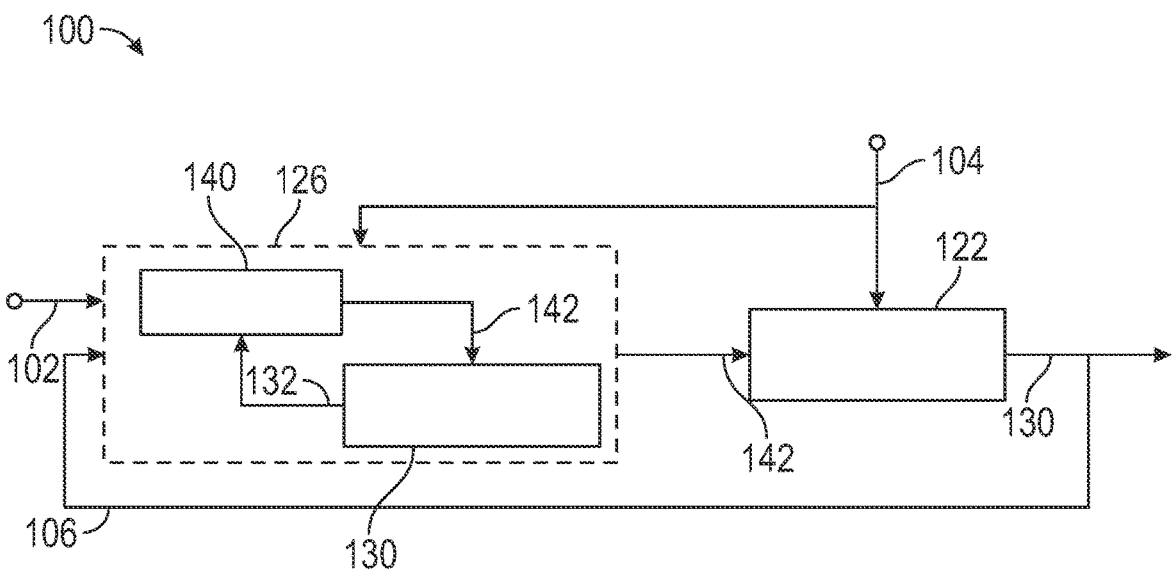
FIG. 2 is a schematic representation of a battery control system including charging control and predictive thermal management control.

With continued reference to FIG. 1, FIG. 2 illustrates an exemplary control system 100 for controlling charge/discharge operations of a battery system 122, such as could be used within the battery system 22 of FIG. 1.

The control system 100 includes a control 126 having a battery/thermal model 130 and an optimizer 140 configured to operate in conjunction with each other to output control signals to a battery/thermal system 122, thereby controlling the operations of the battery/thermal system 122. The control 126 includes an input 102 defining a reference value to which the system is to be controlled (e.g. a charge state of the battery system 122), a second set of inputs 104 corresponding to a driver command such as speed and/or acceleration commands (in the case of charging while the vehicle is operating) and/or an available power from a charging source (in the case of a stationary charging operation). In addition a safe temperature window for charging can be stored within the controller and/or stored within a general vehicle controller. The control 126 includes a feedback input 106 that receives feedback signals output by the battery/thermal system 122.

The battery system 122 includes conventional sensors and estimators configured to measure and/or estimate real time properties of the battery system and the thermal system including output voltage, output current, state of charge, battery temperature, coolant temperature, ambient temperature, battery state of health. The measured outputs 130 are provided to the feedback input 106 and provide the control feedback utilized within the control 126.

Within the control 126, the battery/thermal model 130 is a predictive physics-based model that uses the inputs received to predict future states (e.g. temperature, state of charge) of the battery/thermal system 122 based on a control signal 142 output from the optimizer 140. The predicted future temperature is provided to the optimizer as a feedback signal 132, and the optimizer 140 adjusts the controls based on the predicted future state and the received inputs. In some examples, the predicted future temperature can be considered at a point in the range of 10 to 60 seconds in the future. The control signal 142 is also output from the control 126 to the battery/thermal system 122, which then operates based on the output control signal 142.

In one specific example, the optimizer takes the form of the cost function:

$$J = \sum_{t=1}^{N} \{(1 - C_s(t))^2 + \gamma_1 P_{chrg}^2(t) + \gamma_2 (P_h^2(t) + P_c^2(t))\} \quad \text{Equation 1}$$

Where t is the future time of the prediction, $C_s(t)$ is a lithium surface density of the batteries within the battery/thermal system 122 at time t, $P_{Chrg}(t)$ is the charging power at time t, $P_h(t)$ is a power required to heat the battery/thermal system 122 at time t, and $P_c(t)$ is a power required to cool the battery/thermal system 122 at time t. $\gamma_1$ and $\gamma_2$ are constants. In addition, the example cost function is provided with constraints requiring the lithium plating and over-drain to be maintained less than or equal to 1 and greater than or equal to zero, the temperature (T) of the battery/thermal system 122 to be maintained above a minimum temperature and below a maximum temperature (e.g., maintained within a window of operation). Additional constraints can be situationally applied. In one example, when charging from a wall charger, a constraint requiring 0 is less than or equal to $P^2_{Chrg}(t)+P^2_h(t)+P^2_c(t)$ is less than or equal to available wall power can be applied. In another example, when the vehicle is being driven, $\gamma_1$ is set to be much smaller than $\gamma_2$ thereby removing the charging power from the control inputs.

Applying the control system 100 of FIG. 2 results in a smoother charging profile, that avoids on/off thermal management throughout the charging and ensures that the battery system stays within the temperature window during the entire charging operation.

Figure 3:
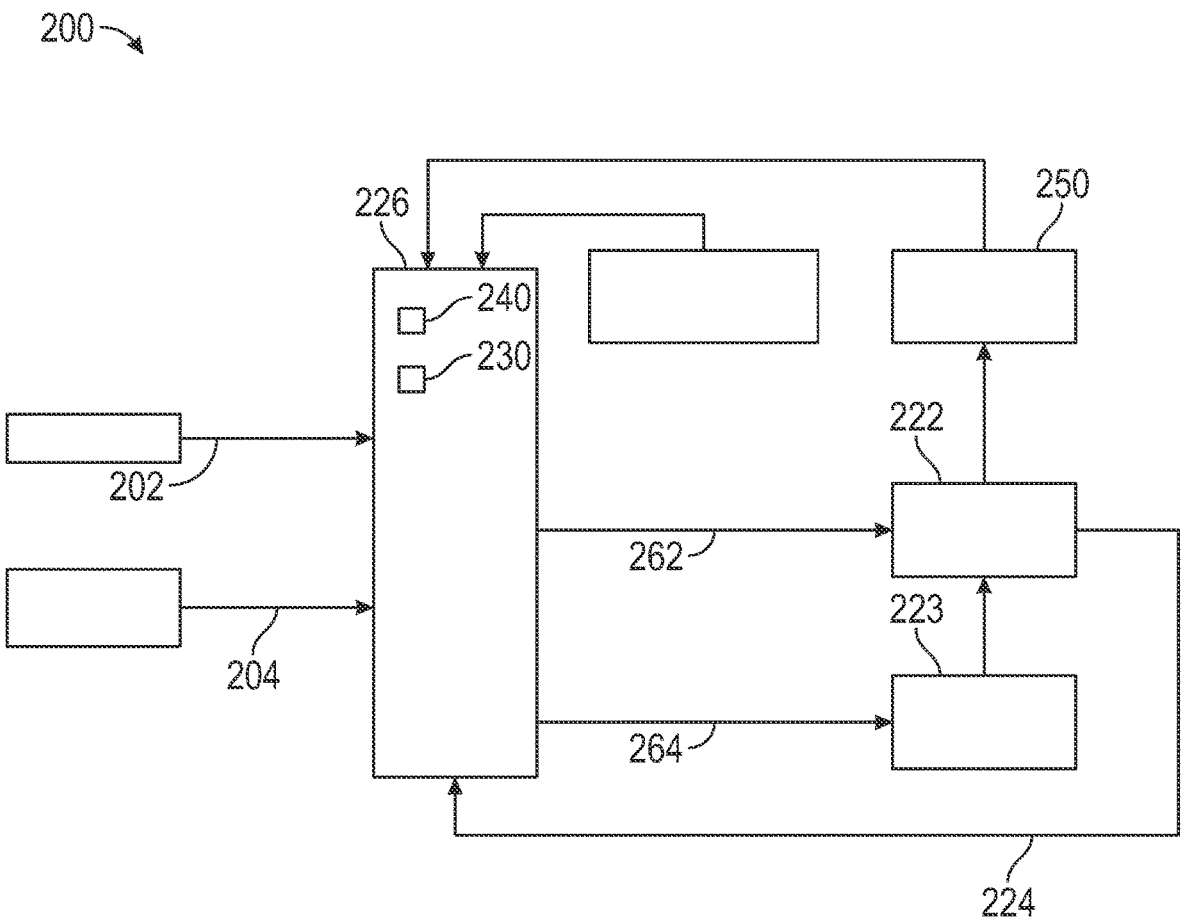
FIG. 3 is a detailed schematic representation of the battery control system of FIG. 2 according to one specific embodiment.

With continued reference to FIGS. 1 and 2, FIG. 3 schematically illustrates another example control system 200 configured to utilize a predictive thermal management control 226. The system controller 226 is functionally the same as the control 126 of control system 100, with the addition of other inputs that are factored into the optimizer 240 and the predictive model 230. In the example of FIG. 3, the control 226 receives driver instructions, such as a pedal position and/or an acceleration instruction, to the vehicle at a first input 202 or charging characteristics, such as available charging power, output current, output voltage, and the like, from a stationary charging station at a second input 204.

Sensor readings 224 from an output of a battery system 222 including a state of charge of the batteries, a temperature of the battery system 222, and the like are provided to the predictive thermal management control 226.

In addition, vehicle dynamics 250, such as speed, acceleration, and the like are provided from one or more general vehicle controllers to the predictive thermal management control 226. Furthermore, in some optional scenarios, environmental conditions can be provided to the thermal management control 226. By way of example, the environmental conditions can include precipitation (rain, snow, ice), ambient temperature, wind speeds, humidity, and/or any other information measured or determined from environmental sensors on the vehicle. The environmental conditions are applied by the thermal management control 226 to adjust the expected effectiveness of the thermal system 223, which in turn affects the predicted future temperature.

Based on all of the received inputs, the thermal management control 226 predicts the future temperature(s) of the battery system 222 and optimizes the charging operation using a cost function similar to, or the same as, Equation 1 (above). The optimized charging operation includes a charging/discharging power command 262 output from the thermal management control 226 to the battery system 222, and a heating/cooling power command 264 output from the thermal management control 226 to the thermal system 223. Each of the output controls 262, 264 controls the corresponding systems 222, 223.

By using the predictive thermal management charging system described herein, the charging operation can be smoothed and the number of on/off thermal operation can be substantially reduced or eliminated, thereby increasing the lifecycle and health of the battery.

The terms "a" and "an" do not denote a limitation of quantity, but rather denote the presence of at least one of the referenced item. The term "or" means "and/or" unless clearly indicated otherwise by context. Reference throughout the specification to "an aspect", means that a particular element (e.g., feature, structure, step, or characteristic) described in connection with the aspect is included in at least one aspect described herein, and may or may not be present in other aspects. In addition, it is to be understood that the described elements may be combined in any suitable manner in the various aspects.

When an element such as a layer, film, region, or substrate is referred to as being "on" another element, it can be directly on the other element or intervening elements may also be present. In contrast, when an element is referred to as being "directly on" another element, there are no intervening elements present.

Unless specified to the contrary herein, all test standards are the most recent standard in effect as of the filing date of this application, or, if priority is claimed, the filing date of the earliest priority application in which the test standard appears.

Unless defined otherwise, technical and scientific terms used herein have the same meaning as is commonly understood by one of skill in the art to which this disclosure belongs.

While the above disclosure has been described with reference to exemplary embodiments, it will be understood by those skilled in the art that various changes may be made and equivalents may be substituted for elements thereof without departing from its scope. In addition, many modifications may be made to adapt a particular situation or material to the teachings of the disclosure without departing from the essential scope thereof. Therefore, it is intended that the present disclosure not be limited to the particular embodiments disclosed, but will include all embodiments falling within the scope thereof.

What is claimed is:

1. A method for controlling a vehicle charging and thermal operation comprising:
   monitoring at least a charge characteristic of a battery system and a thermal characteristic of the battery system;
   predicting a battery system temperature at a future time (t) based at least in part on the monitored characteristics using a predictive physics model;
   maintaining the battery system temperature above a minimum temperature threshold and below a maximum temperature threshold by adjusting a charging profile based at least in part on the predicted battery system temperature; and
   adjusting the charging profile comprises applying a cost function, the cost function being configured to optimize for at least maximum charging power with minimum heating power and minimum cooling power.

2. The method of claim 1, wherein the cost function is further configured to optimize for minimal lithium plating and over-drain.

3. The method of claim 2, wherein the cost function is:

$$J = \sum_{t=1}^{N} \{(1 - C_s(t))^2 + \gamma_1 P^2_{chrg}(t) + \gamma_2 (P^2_h(t) + P^2_c(t))\},$$

and wherein t is the future time of the predicted battery system temperature, $C_s(t)$ is a lithium surface density of the battery system at time t, $P^2_{Chrg}(t)$ is a charging power at time t, $P^2_h(t)$ is a power required to heat the battery system at time t, and $P^2_c(t)$ is a power required to cool the battery system at time t, and $\gamma_1$ and $\gamma_2$ are constants.

4. The method of claim 1, wherein the thermal characteristic of the battery system includes at least a temperature of the battery system.

5. The method of claim 4, wherein the thermal characteristic further includes a rate of change of the temperature of the battery system.

6. The method of claim 1, wherein the charge characteristic of the battery system includes at least one of a current state of charge, state of health, an output voltage, an output current, and a rate of change of the current state of charge.

7. The method of claim 1, further comprising monitoring environmental characteristics of the vehicle, wherein the environmental characteristics include at least one of an ambient temperature and a precipitation type.

8. The method of claim 1, further comprising monitoring a vehicle dynamics characteristic, the vehicle dynamics characteristic including at least one of a vehicle speed, a vehicle acceleration, a commanded vehicle speed, and a commanded vehicle acceleration.

9. A vehicle comprising:
a battery system; and
a battery system controller comprising a non-transitory memory and a processor, the non-transitory memory storing instructions configured to cause the battery system controller to perform a method of:
monitoring at least a charge characteristic of a battery system and a thermal characteristic of the battery system (monitored characteristics),
predicting a battery system temperature at a future time (t) based at least in part on the monitored characteristics using a predictive physics model, and
maintaining the battery system temperature above a minimum temperature threshold and below a maximum temperature threshold by adjusting a charging profile and heating/cooling profile based at least in part on the predicted battery system temperature, wherein adjusting the charging profile comprises applying a cost function, the cost function being configured to optimize for at least maximum charging power with minimum heating power and minimum cooling power.

10. The vehicle of claim 9, wherein the battery system controller is a single dedicated controller.

11. The vehicle of claim 9, wherein the battery system controller is a plurality of distributed processors including at least one general vehicle controller processor.

12. The vehicle of claim 9, wherein the cost function is further configured to optimize for minimal lithium plating and over-drain.

13. The vehicle of claim 12, wherein the cost function is:

$$J = \sum_{t=1}^{N} \{(1 - C_s(t))^2 + \gamma_1 P_{chrg}^2(t) + \gamma_2 (P_h^2(t) + P_c^2(t))\},$$

and wherein t is the future time of the predicted battery system temperature, $C_s(t)$ is a lithium surface density of the battery system at time t, $P_{Chrg}(t)$ is a charging power at time t, $P_h(t)$ is a power required to heat the battery system at time t, and $P_c(t)$ is a power required to cool the battery system at time t, and $\gamma_1$ and $\gamma_2$ are constants.

14. The vehicle of claim 9, wherein the thermal characteristic of the battery system includes at least a temperature of the battery system.

15. The vehicle of claim 14, wherein the thermal characteristic further includes a rate of change of the temperature of the battery system.

16. The vehicle of claim 9, wherein the charge characteristic of the battery system includes at least one of a current state of charge, state of health, an output voltage, an output current, and a rate of change of the current state of charge.

17. The vehicle of claim 9, further comprising monitoring environmental characteristics of the vehicle, wherein the environmental characteristics include at least one of an ambient temperature and a precipitation type.

18. The vehicle of claim 9, further comprising monitoring a vehicle dynamics characteristic, the vehicle dynamics characteristic including at least one of a vehicle speed, a vehicle acceleration, a commanded vehicle speed, and a commanded vehicle acceleration.

19. The method of claim 1, wherein the cost function includes constraints requiring a lithium plating and an over-drain to be maintained less than or equal to 1 and greater than or equal to zero.

20. The vehicle of claim 9, wherein the cost function includes constraints requiring a lithium plating and an over-drain to be maintained less than or equal to 1 and greater than or equal to zero.

* * * * *